United States Patent [19]

Evans

[11] 4,038,566
[45] July 26, 1977

[54] MULTIPLIER CIRCUIT

[75] Inventor: Ronald C. Evans, Binghamton, N.Y.

[73] Assignee: McIntosh Laboratory, Inc., Binghamton, N.Y.

[21] Appl. No.: 669,053

[22] Filed: Mar. 22, 1976

[51] Int. Cl.² .......................................... H03K 17/00
[52] U.S. Cl. ................................... 307/229; 307/230; 328/145; 328/160
[58] Field of Search ................ 307/229, 230; 328/160, 328/145; 330/107

[56] References Cited

U.S. PATENT DOCUMENTS

| 3,532,868 | 10/1970 | Embley | 328/145 |
| 3,714,462 | 1/1973 | Blackmer | 328/160 |
| 3,928,774 | 12/1975 | Wilson | 307/229 |

Primary Examiner—Stanley D. Miller, Jr.
Assistant Examiner—B. P. Davis
Attorney, Agent, or Firm—Pollock, Vande Sande & Priddy

[57] ABSTRACT

A gain control or multiplier circuit in which an ac signal is applied through bipolar diodes having logarithmic response characteristics to the bases of bipolar transistors connected in series and having an output at their junction, the diodes being directly cross connected to the bases, and gain control signals of opposite polarities being applied to the bases, thereby providing a linear output from the transistors despite their non-linear response characteristics.

10 Claims, 1 Drawing Figure

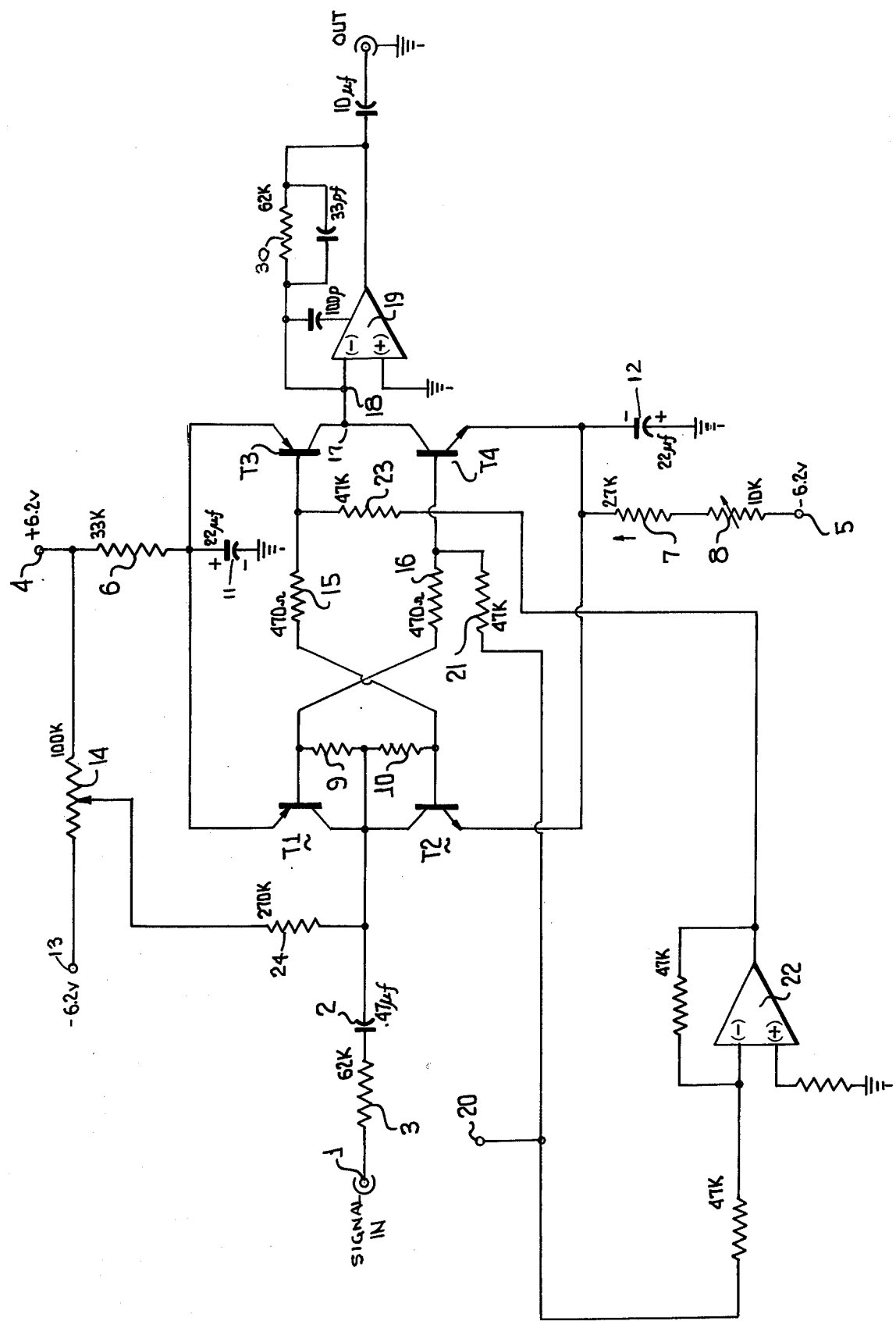

MULTIPLIER CIRCUIT

BACKGROUND OF THE INVENTION

It is known in the prior art to provide amplifier circuits having gain control, which amplify complex ac signals to a level determined by a dc control voltage. So long as the dc voltage varies over a relatively small range of values, such systems may be quite simple. However, for wide ranges of gain, non-linearities appear because the responses of transistors are not linear, but are anti-logarithmic. To compensate for the anti-logarithmic responses of transistors, the ac signals has been heretofore applied to the transistors via circuitry which has a logarithmic response (see Blackmer U.S. Pat. No. 3,714,462). The present invention represents an improvement in circuitry of the latter type.

SUMMARY OF THE INVENTION

A gain controllable amplifier capable of wide variations of gain while retaining linearity of response, including a pair of transistors operating as diodes and having a logarithmic response, cross connected to the bases of a series pair of transistors operating as a bipolar amplifier stage, gain control voltage being applied in opposite polarities to the bases of the series pair of transistors and to the bases of the diodes.

DESCRIPTION OF THE DRAWINGS

The single FIGURE is a schematic circuit diagram of a system according to the invention.

DETAILED DESCRIPTION

In the FIGURE, 1 is a signal input terminal, a suitable signal having a wide band audio frequency spectrum. The signal is applied to the collectors of PNP and NPN transistor, T1 and T2, via capacitor 2 and resistance 3. The emitters of transistors T1 and T2 are connected respectively to respectively positive and negative voltage terminals 4 and 5, in the case of terminal 4 via a resistance 6, and in the case of terminal 5 via fixed resistance 7 and variable resistance 8. The bases of transistors T1 and T2 are connected to the collectors via small resistances 9 and 10, so that essentially the transistors T1 and T2 operate as diodes connected in the conductive mode. Capacitors 11 and 12 are by-pass capacitors connecting the emitters of T1 and T2 to ground. Terminal 4 being at +6.2V, a further terminal 13 at −6.2V is provided, which is connected to terminal 4 via a potentiometer 14. The collectors of transistors T1 and T2 are connected to the slider of potentiometer 14 through resistor 24 to establish a bias, which is adjustable. The bias is so set that the effective diodes provided by T1 and T2 have a symmetrical logarithmic response, implying that a sinusoidal wave input will be flattened.

The bases of T1 and T2 are connected via small resistances 15 and 16 to the bases of series connected transistors T3 and T4, T3 being PNP and T4 being NPN. T3 and T4 are connected in series collector to collector with emitters connected between terminals 4 and 5, respectively, via resistances 6 and 7, and 8, respectively. The collectors of T3 and T4 are directly joined, at a terminal 17 which is normally at ground potential for balanced conditions. Terminal 17 is connected to a terminal 18 of linear operational amplifier 19, the remaining input terminal of which is grounded. A suitable output circuit is illustrated to convert the current of transistors T3, T4 to a voltage.

A dc control terminal 20 is provided which is directly connected via resistance 21 to the base of T4 and which is connected via an inverter 22 and resistance 23 to the base of T3. The voltage applied to the control terminal 20 may vary from +4.V to −10.V, and serves to vary the gains of T3 and T4 over a large range. T3 and T4 have anti-logarithmic responses, so that absent T1 and T2 the overall response of the system would be anti-logarithmic. The presence of T1 and T2, which have logarithmic responses, and which are cross connected to the bases of T3 and T4, renders the overall response of the system linear over a wide range of input amplitudes and of system gains.

The bias supplied by potentiometer 14 enables control of the response curves of T1, T2, so as to assure linearity of system response. Adjustment of resistance 8 enables the output of amplifier 19 to be a virtual ground, i.e., zero dc current into it at terminal 18.

The term "gain" as used herein means amplification of greater or less than unity, the system being also capable of operating as an adjustable attenuator in response to appropriate control voltages applied to control terminal 20.

For best operation the PNP transistors should be matched to each other and likewise with the NPN transistors. For instance, suitable transistors will be those whose $V_{be}$ is within 5 mv of each other at a specified operating current. In addition, the 47k resistors 21 and 23 should be the same to within 0.5% so that the dc into the bases of T3 and T4 are equal and of opposite polarity. Under these circumstances the collector currents will be equal and no dc will flow into terminal 18. Since the 47k resistors connected to amplifier 22 determine its gain (which should be 1 since it is used as an inverter), these resistors, also, should be matched.

In one embodiment with the components matched as outlined above, gain can be unity with zero control voltage by making the ratio of resistors 3 and 30 to be unity. Likewise, gain with zero control voltage can be varied by varying the ratio of resistors 3 and 30.

Variations can be made to the illustrated circuit without departing from the scope of my invention. For instance, amplifier 22 is used as an inverter and it need not be the operational amplifier illustrated. Also amplifier 19 is a current to voltage converter and it need not comprise the illustrated operational amplifier.

What I claim is:

1. An electrical gain control system providing linear response over a wide range of gains including first bipolar diode circuit means for providing first output signals which are logarithmically related to an applied input signal, second bipolar circuit means connected in cascade with said first circuit means for providing a second output signal which is an anti-logarithmic function of input signals applied to said second bipolar circuit means, and means for applying dc gain control voltage to said second bipolar circuit means, said second bipolar circuit means comprising a pair of series connected variable gain transistors of opposite conductivity types having an output terminal at the junction of said pair of series connected transistors.

2. The combination according to claim 1, wherein said bipolar diode circuit means includes two transistors connected in series in the conductive direction, and a single lead for applying said applied input signal to the collectors of said two transistors.

3. The combination according to claim 2, wherein is provided low resistance connections between the bases of said two transistors and the collectors of said two transistors to provide diode operation.

4. The combination according to claim 3, wherein is provided means for applying said dc gain control voltage in equal amplitudes but in opposite polarities to the bases of said pair of series connected transistors.

5. The combination according to claim 4, wherein said dc gain control voltage has a range extending from negative to positive voltages, the system having unit gain at zero control volts.

6. The system according to claim 5, wherein is provided means for adjusting the output of said system to zero volts dc in response to zero control volts, said last means including a variable resistance in cascade with said pair of series connected variable gain transistors.

7. The combination according to claim 4 wherein said dc gain control voltage has a range extending from negative to positive voltages, the system having non-unity gain at zero control volts.

8. The combination of claim 1 which further includes output means connected to said output terminal for providing an output voltage in accordance with the current in said output terminal.

9. The combination of claim 4 which further includes output means connected to said output terminal for providing an output voltage in accordance with the current in said output terminal.

10. The combination of claim 6, which further includes output means connected to said output terminal for providing an output voltage in accordance with the current in said output terminal.

* * * * *